United States Patent
Zhao et al.

(10) Patent No.: US 10,629,271 B2
(45) Date of Patent: Apr. 21, 2020

(54) METHOD AND SYSTEM FOR REDUCING PROGRAM DISTURB DEGRADATION IN FLASH MEMORY

(71) Applicant: Intel Corporation, Santa Clara, CA (US)

(72) Inventors: Han Zhao, Santa Clara, CA (US);
Pranav Kalavade, San Jose, CA (US);
Krishna K. Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/831,984

(22) Filed: Dec. 5, 2017

(65) Prior Publication Data
US 2019/0043594 A1 Feb. 7, 2019

(51) Int. Cl.
| G11C 16/04 | (2006.01) |
| G11C 16/34 | (2006.01) |
| G11C 11/56 | (2006.01) |
| G11C 16/08 | (2006.01) |

(52) U.S. Cl.
CPC ...... *G11C 16/3418* (2013.01); *G11C 11/5628* (2013.01); *G11C 16/04* (2013.01); *G11C 16/08* (2013.01); *G11C 16/3427* (2013.01); *G11C 16/3459* (2013.01); *G11C 16/0483* (2013.01); *G11C 16/3422* (2013.01); *G11C 16/3431* (2013.01)

(58) Field of Classification Search
CPC . G11C 16/3418; G11C 16/3459; G11C 16/08; G11C 16/0483; G11C 16/3427; G11C 16/3431; G11C 16/3422; G11C 11/5628
See application file for complete search history.

(56) References Cited

U.S. PATENT DOCUMENTS

| 5,848,002 A | * | 12/1998 | Inada | G11C 11/56 365/189.15 |
| 9,589,660 B1 | * | 3/2017 | Hashimoto | G11C 16/3459 |
| 9,830,994 B1 | * | 11/2017 | Mitsuhira | G11C 16/26 |
| 2006/0245251 A1 | * | 11/2006 | Shirota | G11C 16/0483 365/185.17 |
| 2014/0133238 A1 | | 5/2014 | Rhie | |
| 2015/0221373 A1 | * | 8/2015 | Nam | G11C 16/0483 365/185.02 |

(Continued)

OTHER PUBLICATIONS

International Search Report and Written Opinion received in issued in PCT Application No. PCT/US2018/058606, dated Feb. 22, 2019, 12 pages.

*Primary Examiner* — Sultana Begum
(74) *Attorney, Agent, or Firm* — Grossman, Tucker, Perreault & Pfleger, PLLC

(57) ABSTRACT

Reduction of program disturb degradation in a flash memory cell array is facilitated by selectively switching wordline voltage levels in a sequence that reduces the likelihood of trapping electrons in memory cell channels. During a program verify operation for a memory cell in a memory cell string, a flash memory system switches wordline voltage levels from high-to-low for interface wordlines, prior to switching wordline voltages from high-to-low for other wordlines in a memory cell string. Selectively switching wordlines in a sequence in the memory cell string enables electrons to migrate to ground or to a source voltage through upper and lower select gates.

18 Claims, 7 Drawing Sheets

(56) References Cited

U.S. PATENT DOCUMENTS

2017/0062068 A1    3/2017  Rabkin et al.
2017/0110198 A1    4/2017  Zhao et al.
2017/0271010 A1*  9/2017  Kajigaya ............ G11C 14/0027

* cited by examiner

METHOD AND SYSTEM FOR REDUCING PROGRAM DISTURB DEGRADATION IN FLASH MEMORY

TECHNICAL FIELD

The present disclosure relates to systems and methods for improving flash memory performance.

BACKGROUND

Some types of flash memory include memory cells that can each be programmed to multiple levels. Instead of simply storing a charge or voltage that is representative of a logical '1' or '0', the memory cells can store different quantities of charge that are representative of, for example, levels 0, 1, and 2, or levels 0, 1, 2, 3, 4, 5, 6, and 7. These tri-level cell ("TLC") memory or multi-level cell ("MLC") memory expand the quantity of information stored in a single cell, but these expansive features come at a cost.

One of the difficulties or issues associated with TLC or MLC memory is that certain conditions can cause a value or level stored in a cell to be inadvertently changed, effectively causing the memory cell to be mis-programmed. Flash memory cells store different quantities of charge to a floating gate of the memory cell to alter the threshold voltage of the transistor that constitutes the memory cell. If a programming voltage is higher than anticipated or if more electrons (than are anticipated) are available at the channel of the memory cell being inhibited, then Fowler-Nordheim tunneling may result in inadvertent over-programming of a memory cell, which is one type of program disturb.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
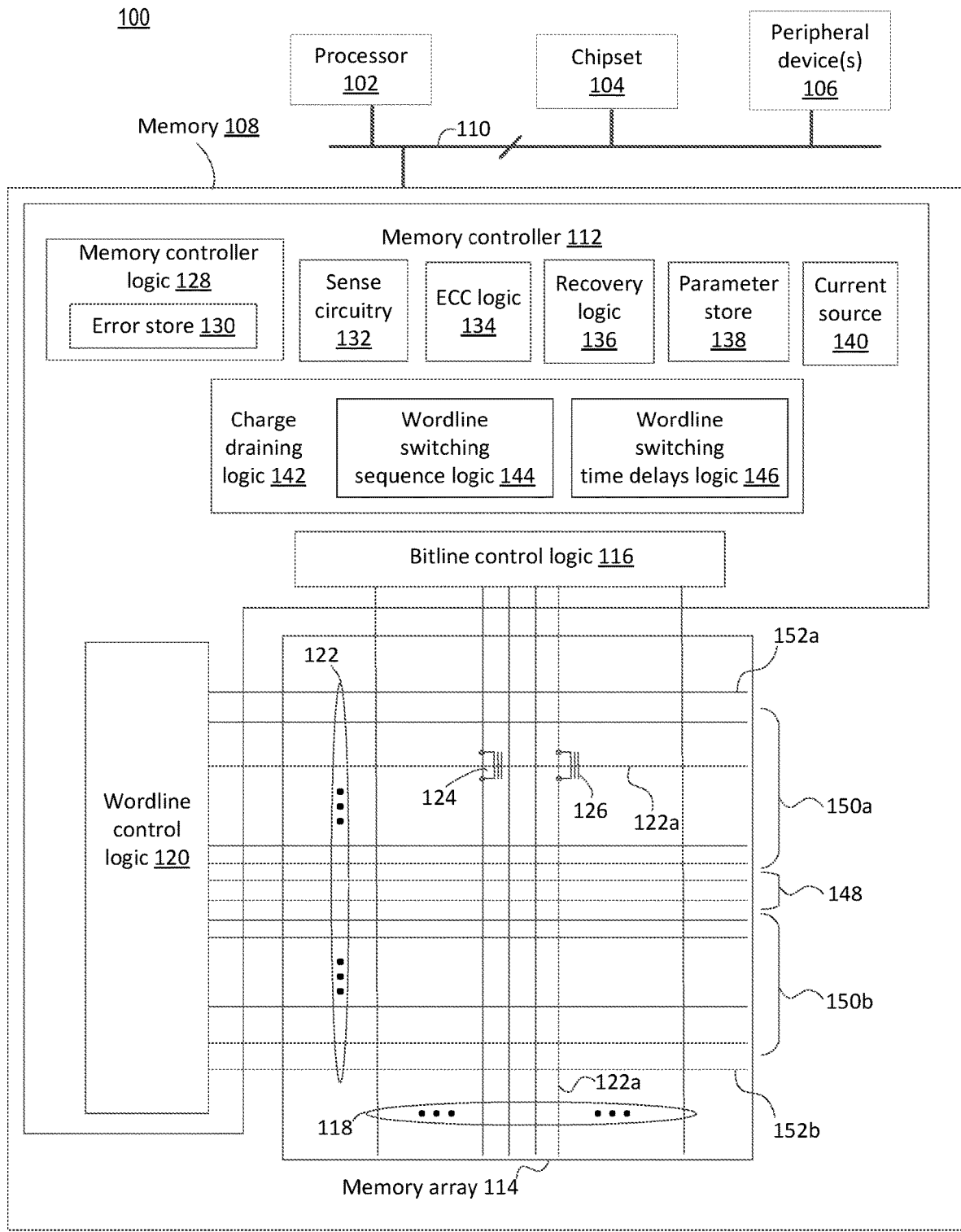
FIG. 1 is an example of a schematic depicting an illustrative system that sequences wordline switching to reduce program disturb degradation in flash memory cells, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

Reduction of program disturb degradation in a flash memory cell array is facilitated by selectively switching wordline voltage levels in a sequence that reduces the likelihood of trapping electrons in memory cell channels. During a program verify operation for a memory cell in a memory cell string, a flash memory system switches wordline voltage levels from high-to-low for interface wordlines, prior to switching wordline voltages from high-to-low for other wordlines in a memory cell string. Selectively switching wordlines in a sequence in the memory cell string enables electrons to migrate to ground or to a source voltage through upper and lower select gates.

Programming single-level cell ("SLC"), multi-level cell ("MLC"), or tri-level cell ("TLC") memory cells includes repeatedly applying a voltage, testing the threshold voltage of the memory cell, and applying an increased programming voltage to the memory cell until the floating gate stores enough charge to sustain a predetermined threshold voltage (Vth). At the same time, there are also some cells which will not get programmed at all (level 0 "L0" cells), but they are sharing the same WL with the cells which are programmed to higher level. These L0 cells are the ones which need to be inhibited during program, which is done through boosting the voltage level of the channel of the L0 cells (or other cells along the wordline).

In between the application of a first programming voltage level and a second (increased) programming voltage level, increasing the quantity of free electrons in the channel of the memory cell being inhibited will reduce the channel boosting voltage of the inhibited channel, and consequently increase the quantity of charge that passes to the floating gate through Fowler-Nordheim tunneling ("FNT").

Three-dimensional (3D) flash memory, such as 3D NAND flash, use pillars of oxide that are surrounded by floating gates and control gates to define a memory cell string of memory cells. The pillars have become tall enough that each pillar is grown in 2 phases, a lower deck and an upper deck. Because aligning channels is difficult, the lower deck is electrically coupled to the upper deck with a doped interface plug. The doped interface plug may be a highly doped N+ silicon that easily generates electrons in response to an electric field. The interface plug contributes electrons more easily than a slightly P-doped bulk or substrate and may be a source of excessive or undesirable quantities of electrons.

A memory controller is provided, according to one embodiment. The memory controller includes charge draining logic to define a sequence of wordline switching operations during a program verify operation of a memory array, according to one embodiment. The sequence of wordline switching operations may enable a charge drain of a channel of at least one memory cell string of a memory array, according to one embodiment.

In one embodiment, the memory controller also includes wordline control logic to, during the program verify operation, switch first wordlines of the memory array from a first voltage level to a second voltage level prior to switching second wordlines of the memory array from the first voltage level to the second voltage level.

A system is provided, according to one embodiment. The system includes a memory array having a plurality of memory cells, the memory array includes at least one memory cell string, and the memory array includes first wordlines and second wordlines, according to one embodiment. The system includes a memory controller, according to one embodiment. The memory controller includes charge draining logic to define a sequence of wordline switching operations during a program verify operation of the memory array, according to one embodiment. The sequence of wordline switching operations may enable a charge drain of a channel of the at least one memory cell string of the memory array, according to one embodiment. The memory controller includes wordline control logic to, during the program verify operation, switch the first wordlines of the memory array from a first voltage level to a second voltage level prior to switching the second wordlines of the memory array from the first voltage level to the second voltage level, according to one embodiment.

A computer readable storage device is provided, according to one embodiment. The computer readable storage device includes instructions that when executed by one or more processors result in a number of operations, according to one embodiment. The operations may switch, during a program verify operation, voltage levels for interface wordlines from a first voltage level to a second voltage level, according to one embodiment. The operations may switch voltage levels for other wordlines from a third voltage level to a fourth voltage level, after the voltage levels for the interface wordlines switch from the first voltage level to the second voltage level, according to one embodiment.

A method is provided, according to one embodiment. The method includes switching, during a program verify operation, voltage levels for interface wordlines from a first voltage level to a second voltage level, according to one embodiment. The method includes switching voltage levels for other wordlines from a third voltage level to a fourth voltage level, after the voltage levels for the interface wordlines switch from the first voltage level to the second voltage level, according to one embodiment.

As used herein, the term program verify operation refers to an operation that is used to verify the threshold voltage of a memory cell after an attempt to program the memory cell has been made. The flash memory system (e.g., the memory controller) applies a program voltage to the control gate of the memory cell to program the memory cell, applies a verify voltage to the memory cell to test the threshold voltage ("Vth"), and repeats the program operation (with a higher voltage) and the verify operation, until the memory cell is programmed to a desired threshold voltage.

As used herein, the term program disturb refers to a programmed memory cell level being inadvertently increased to an unintended memory cell level during a program operation. The term program disturb may also refer to mis-programming a memory cell level with Fowler-Nordheim tunneling due to an unintended abundance of electrons in the channel of a memory cell being inhibited.

As used herein the term inhibit refers to increasing the channel voltage level of memory cells that are not being programmed while one or more cells in a physical page of memory are being programmed. For example, at the beginning of programming, all cells are erased, and different cells are programmed to different levels. To prevent an L0 cell from being programmed up to a level greater than L0 is to inhibit the L0 cell(s) while the wordline for the L0 cell(s) receive program pulses, to prevent an L1 cell from being programmed up to a level greater than L1 is to inhibit the L1 cell(s) after the L1 cell(s) pass L1 verifying operation, to prevent an L2 cell from being programmed up to a level greater than L2 is to inhibit the L2 cells after the L2 cells pass L2 verifying operations, and so forth. Inhibiting is performed by boosting the channel. For example, for a programming voltage level of 20 V, the channel is boosted to 10 V (or some similar voltage) so that the voltage potential across the control and floating gates is limited to 10 V, which is too low for effective Fowler-Nordheim tunneling. If channel is not boosted (during programming), the cell will see a 20 V voltage drop and Fowler Nordheim tunneling will cause large amounts of electron injection into floating gate.

FIG. 1 illustrates a block diagram of a system 100 consistent with several embodiments of the present disclosure. System 100 may correspond to a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone.

The system 100 may include a processor 102 that is communicatively coupled to a chipset 104, peripheral device (s) 106, and a memory 108, according to one embodiment. The processor 102, the chipset 104, the peripheral device(s) 106, and the memory 108 are communicatively and/or physically coupled to each other through one or more buses 110, according to one embodiment. The processor 102 may correspond to a single core or a multi-core general purpose processor, such as those provided by Intel® Corporation, etc., according to one embodiment. The chipset 104 may include, for example, a set of electronic components that includes the one or more buses 110 to facilitate communication between components of the system, and that manages data flow between the processor 102, the memory 108, and the peripheral device(s) 106, according to one embodiment. The peripheral device(s) 106 may include, for example, user interface device(s) including a display, a touch-screen display, a printer, a keypad, a keyboard, wired and/or wireless communication logic, and storage device(s) (including hard-disk drives, solid-state drives, and removable storage media), etc., according to one embodiment. It should be noted that system 100 is simplified for ease of illustration and description.

The memory 108 is coupled to the processor 102 and is configured to receive instructions, receive addresses, receive data, and provide data to the processor 102 and to the bus 110, in response to one or more instructions received from the processor 102, according to one embodiment. The memory 108 may be a memory package that includes one or more memory controllers and one or more memory arrays, the memory 108 may include a plurality of memory die, or the memory 108 may be a single memory die, according to various embodiments. The memory 108 may be a non-volatile memory, e.g., a storage medium that does not require power to maintain the state of data stored by the storage medium, according to one embodiment. Non-volatile memory may include, but is not limited to, a NAND flash memory (e.g., Single-Level Cell ("SLC"), Multi-Level Cell ("MLC"), a Tri-Level Cell ("TLC"), a Quad-Level Cell ("QLC"), or some other NAND), NOR memory, solid-state memory (e.g., planar or three Dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SO- NOS) memory, polymer memory (e.g., ferroelectric polymer memory), byte addressable random accessible 3D crosspoint memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D crosspoint memory may include a transistor-less stackable crosspoint architecture in which memory cells sit at the intersection of wordlines and bitlines and are individually addressable and in which bit storage is based on a change in bulk or channel resistance, in accordance with various embodiments.

The memory 108 includes a memory controller 112 that is configured to address, write to, and read from, a memory array 114, according to one embodiment. The memory controller 112 is configured to perform memory access operations, e.g., reading a target memory cell and/or writing to a target memory cell, ECC check operations, and memory cell recovery operations, according to one embodiment. The memory controller 112 may be partially or fully implemented in the memory die for the memory array 114 or may be partially or fully implemented external to the memory die for the memory array 114, according to various embodiments. The memory array 114 includes a plurality of memory cells that are organized by one or more strings (e.g., columns), pages (e.g., wordlines or rows), blocks, tiles, and planes of memory cells, according to one embodiment.

The memory controller 112 uses bitline control logic and wordline control logic to address and access the memory array 114, according to one embodiment. The memory controller 112 includes bitline control logic 116 that controls a plurality of bitlines 118 (individually, for example, bitline 118a), according to one embodiment. The bitline control logic 116 includes controller logic (e.g., to switch between inhibit, program, erase, and read, voltage levels for the plurality of bitlines 118), according to one embodiment.

The memory controller 112 includes wordline control logic 120 that applies voltage levels to a plurality of wordlines 122 (individually, for example, wordline 122a), according to one embodiment. The wordline control logic 120 includes one or more voltage regulators that generate one or more voltage levels to access, read, program, and/or erase memory cells (e.g., memory cells 124,126) of the memory array 114, according to one embodiment.

The wordline control logic 120 is configured to receive target wordline address(es) from the memory controller 112 and to select or access wordlines for reading (or writing operations), according to one embodiment. For example, the wordline control logic 120 may be configured to select a target wordline by coupling a wordline select bias voltage from a voltage regulator to the target wordline. The wordline control logic 120 may be configured to deselect a target wordline by decoupling the target wordline from the wordline select bias voltage and/or by coupling a wordline deselect bias voltage to the wordline, according to one embodiment. The wordline control logic 120 includes global wordline drivers, according to one embodiment. The wordline control logic 120 includes select gate source ("SGS") and select gate drain ("SGD") drivers, according to one embodiment. The voltage regulator is a wordline ("WL") regulator, according to one embodiment. The wordline control logic 120 is at least partially fabricated under the memory array 114, for example, using CMOS under array ("CUA") fabrication techniques, according to one embodiment.

The memory controller 112 may include additional logic to facilitate memory array operations and communication with one or more of the processor 102, the chipset 104, and the peripheral device(s) 106, according to one embodiment. The memory controller 112 may include one or more of memory controller logic 128, error store 130, sense circuitry 132, ECC logic 134, recovery logic 136, parameter store 138, and a current source 140, according to one embodiment. The memory controller logic 128 may be configured to perform operations associated with memory controller 112. For example, the memory controller logic 128 may manage communications with the processor 102 and may be configured to identify one or more target wordlines associated with each received memory address (e.g., in a read request). The error store 130 includes the fail type for memory read or access fails, according to one embodiment. The sense circuitry 132 may be configured to detect a quantity of current passing through a memory cell, e.g., during a read operation, according to one embodiment. The ECC logic 134 is configured to provide error checking functionality for memory controller 112, according to one embodiment. The recovery logic 136 is configured to manage recovery of failed reads/writes for associated memory cells identified by ECC logic 134 and/or memory controller logic 128, according to one embodiment. The parameter store 138 is configured to store the number of adjacent memory cells to select, and to store parameters associated with a sequence of recovery pulses. The number of adjacent memory cells to select may be based, at least in part, on the type of fail (e.g., read/write), memory array density, and/or maximum current available from the current source 140, according to one embodiment. The current source 140 supplies current to one or more portions of the memory 108, according to one embodiment.

The memory controller 112 includes charge draining logic 142 that causes the wordline control logic 120 to switch the wordlines 122 in a sequence that decreases the likelihood of program disturb degradation, according to one embodiment. The charge draining logic 142 enables the wordline control logic 120 to switch the wordlines 122 from one or more first voltage levels to one or more second voltages levels in a sequence that reduces negative charge (e.g., electrons) from being trapped in one or more portions of a channel in a memory cell string, during a program verify operation, according to one embodiment. The charge draining logic 142 includes a wordline switching sequence logic 144 and includes wordline switching time delays logic 146, according to one embodiment. The wordline control logic 120 applies one or more of the wordline switching sequence logic 144 and the wordline switching time delays logic 146 to the wordlines 122, during a program verify operation for the memory array 114, according to one embodiment.

As an illustrative example, during a program verify operation, the wordline control logic 120 may implement the charge draining logic 142 to: first switch off interface wordlines 148, second switch off other wordlines 150 (individually, upper other wordlines 150a and lower other wordlines 150b), and third switch off select gate wordlines 152 (individually, upper select gate wordline 152a and lower select gate wordline 152b), according to one embodiment. If the memory cell 124 were being programmed, for example, to programming level 7 and memory cell 126 was already programmed to, for example, programming level 0, then sequentially switching the wordlines (as disclosed herein) may decrease the likelihood of the disturbing (e.g., up-programming) the programming level of the memory cell 126, which shares a wordline with the memory cell 124, according to one embodiment. In one embodiment, the wordline control logic 120 uses the wordline switching sequence logic 144 to initially switch the interface wordlines 148 and subsequently switch the other wordlines (inclusive of the other wordlines 150 and the select gate wordlines 152), according to one embodiment. In one embodiment, the wordline control logic 120 uses the wordline switching time delays logic 146 as time delays between switching the interface wordlines 148, the other wordlines 150, and the select gate wordlines 152 from one or more first voltage levels to one or more second voltage levels.

Figure 2:
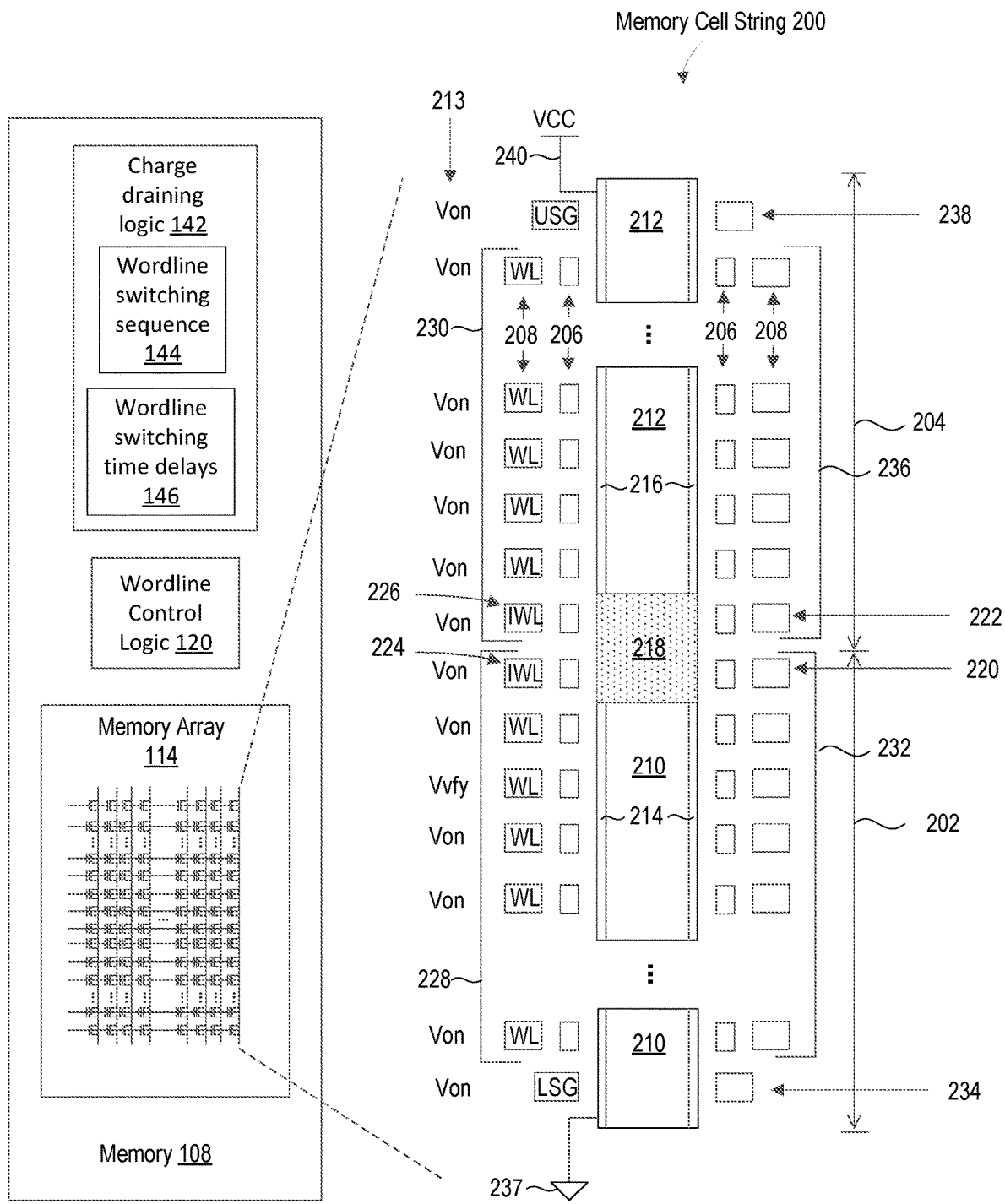
FIG. 2 is an example of a simplified side view cut-away of a memory cell string of a memory array, in accordance with at least one embodiment described herein.

FIG. 2 illustrates a simplified side view cut-away of a memory cell string 200 of the memory array 114 of FIG. 1 consistent with several embodiments of the present disclosure. The wordline control logic 120 is configured to switch or deselect some of the wordlines of the memory array 114 off (or low) before others of the wordlines, to reduce mis-programming (e.g., program disturb degradation) memory cells in the memory array 114, according to one embodiment. The wordline control logic 120 is configured to sequentially switch wordlines from one or more first voltage levels to one or more second voltage levels, during a program verify operation, at least partially based on the charge draining logic 142, the wordline switching sequence logic 144, and/or the wordline switching time delays logic 146, according to one embodiment.

The memory array 114 includes a plurality of memory cells that are organized into one or more strings, pages, blocks, planes, and tiles of memory cells, according to one embodiment. The memory cell string 200 is one illustrative memory cell string of the memory array 114, according to one embodiment. The memory cell string 200 includes a lower deck 202 of memory cells and an upper deck 204 of memory cells, according to one embodiment. The memory cells of the lower deck 202 and of the upper deck 204 may be formed with a number of floating gates 206 and with a number of control gates 208, according to one embodiment. The floating gates 206 and the control gates 208 are illustrated as being on both sides of a lower pillar oxide 210 and on both sides of an upper pillar oxide 212, according to one embodiment. This is a simplified illustration of a cross-section of an implementation of 3D NAND flash memory, in accordance with at least one embodiment disclosed described herein.

The floating gates 206 store charges that affect and at least partially define the threshold voltages ("Vth") for the transistors that constitute the memory cells, according to one embodiment. TLC memory cells are able to store a charge that is representative of up to a 3-bit digital value, according to one embodiment. The memory cells of the memory cell string 200 and of the memory array 114 may be TLC memory cells that may each store one of a number of programming levels (e.g., L0-L7), according to one embodiment. Table 1 includes example programming level information for an example TLC memory cell that may be implemented in the memory cells of the memory array 114, according to one embodiment. The programming levels include L0, L1, L2, L3, L4, L5, L6, and L7, according to one embodiment. A memory cell may be configured to store more or fewer programming levels, according to one embodiment. An effective programming (e.g., maximum) voltage that may be applied to a

TABLE 1

| Program Level | Effective Program Voltage (WL voltage – channel inhibit voltage) | Threshold Voltage | Digital Value |
|---|---|---|---|
| L0 | 10.8 V | −.5 V | 111 |
| L1 | 15 V | .5 V | 011 |
| L2 | 16 V | 1.4 V | 001 |
| L3 | 17 V | 2.1 V | 101 |
| L4 | 17.7 V | 2.6 V | 100 |
| L5 | 18.7 V | 3.3 V | 000 |
| L6 | 19.7 V | 4.0 V | 010 |
| L7 | 20.8 V | 4.8 V | 110 | control gate 208 to program a memory cell to a specific program level is provided in Table 1, according to one embodiment. In practice, a programming voltage level is applied to a memory cell during a programming operation, and the threshold voltage of the memory cell is verified in a subsequent verify operation, according to one embodiment. If the program level is not achieved by the application of the programming voltage level, then the programming voltage level is increased, the memory cell is programmed again, and the memory cell threshold voltage is tested or verified by another verify operation, according to one embodiment. This process is repeated until the memory cell stores the intended program level, according to one embodiment. The digital values of the program levels correspond to the program levels as shown in Table 1, according to one embodiment. Other digital values may be assigned to the program levels (e.g., L0=0, L1=1, etc.), according to other implementations.

Each of the control gates 208 are a portion of wordlines that are used to apply a wordline voltage level to a row or bank of memory cells, according to one embodiment. During a program verify operation, example wordline voltage levels 213 are applied to the control gates 208 of the memory cells of the lower deck 202 and of the upper deck 204, according to one embodiment. An on-voltage level ("Von") is a voltage level that causes a memory cell to invert its channel to make the channel of the memory cell conductive. The on-voltage level Von is high enough to invert the channel of the memory cell regardless of the programmed level (e.g., L0-L7) of the memory cell, according to one embodiment. The on-voltage level Von is 8 V, according to one embodiment. The verify voltage level ("Vvfy") is a voltage level that is applied to a memory cell that has been programmed and that has a threshold voltage Vth that is being verified to determine which programming level (e.g., L0-L7) the memory cell is currently storing. The verify voltage level Vvfy may be 4.5 volts, but is subject to change, based on the programming level that is being verified, according to one embodiment.

During the verify operation, memory cells (other than the memory cell being verified) of the memory cell string 200 invert a lower channel 214 in the lower pillar oxide 210 and invert the upper channel 216 in the upper pillar oxide 212, responsive to the wordline voltage levels 213 being applied to the control gates 208, according to one embodiment.

While manufacturing the memory cell string 200, aligning the lower channel 214 with the upper channel 216 may present challenges in alignment for the memory cell string 200. One solution to overcoming potential misalignment between the lower channel 214 and the upper channel 216 is disposing a doped interface plug 218 between the lower pillar oxide 210 and the upper pillar oxide 212, according to one embodiment. The doped interface plug 218 is diffused or otherwise doped with donor atoms such as phosphorus, arsenic, antimony, bismuth, lithium, or other atoms that have 5 valence electrons or more, according to one embodiment. The doped interface plug 218 may be doped as N+ silicon to improve the conductivity of the doped interface plug 218, according to one embodiment.

The memory cell string 200 includes a lower interface memory cell 220 and an upper interface memory cell 222, according to one embodiment. The lower interface memory cell 220 and the upper interface memory cell 222 are formed around the doped interface plug 218 but are not typically used to store information, according to one embodiment. The lower interface memory cell 220 and the upper interface memory cell 222 have control gates that are portions of interface wordline 224 and interface wordline 226, respectively, according to one embodiment. To reduce the effects of program disturb in the memory cell string 200, the wordline control logic 120 switches the wordline voltage levels 213 for the interface wordlines 224, 226 from one or more first voltage levels to one or more second voltage levels (e.g., high to low), prior to switching the wordline voltage levels 213 for the other wordlines from one or more first voltage levels to one or more second voltage levels (e.g., high to low), according to one embodiment.

The other wordlines include lower wordlines 228 and upper wordlines 230, according to one embodiment. The wordline control logic 120 and/or the charge draining logic 142 enable excess electrons that are sourced by the doped interface plug 218 and the lower deck memory cells 232 to migrate through the lower select gate ("LSG") 234 to ground 237, by ramping down (e.g., switching from higher voltage level to a lower voltage level on the wordlines) the lower wordlines 228 prior to switching off the wordline voltage level 213 for the lower select gate 234, according to one embodiment. The wordline control logic 120 and/or the charge draining logic 142 enables excess electrons that are sourced by the doped interface plug 218 and the upper deck memory cells 236 to migrate through the upper select gate ("USG") 238 to VCC or to the bitline 240, by ramping down the upper wordlines 230 prior to switching off the wordline voltage level 213 for the upper select gate 238, according to one embodiment.

A technical problem that can exist when programming, verifying, and reprogramming a memory cell in the memory cell string 200 relates to trapped electrons inadvertently altering programming operations (e.g., Fowler-Nordheim tunneling). Trapped electrons in the lower channel 214 or in the upper channel 216 that are generated and trapped during a verify operation, may migrate to a memory cell that is being inhibited (e.g., shares a wordline with a memory cell that is being programmed), in a subsequent program operation. The additional sources of electrons both from memory cells having a relatively low threshold voltage (e.g., a low programmed level like L0, L1) and the additional source electrons from the interface memory cells 220, 222 can cause a memory cell to be over-programmed, according to one embodiment. However, the technical solution described herein operates the wordline voltage levels 213 in a sequence that reduces the likelihood of having electrons trapped in the lower channel 214 or in the upper channel 216, prior to program operations that occur after a verify operation, according to one embodiment.

To reduce the likelihood of having electrons trapped in the lower channel 214 (or in part of the lower channel 214) or in the upper channel 216 (or part of the upper channel 216), the wordline control logic 120, the charge draining logic 142, and/or the memory controller 112 decreases the wordline voltage levels 213 on the interface memory cells 220, 222 prior to decreasing the wordline voltage levels 213 for the lower deck memory cells 232, for the lower select gate 234, for the upper deck memory cells 236, and for the upper select gate 238, according to one embodiment. In one implementation, the wordline control logic 120, the charge draining logic 142, and/or the memory controller 112 decreases the wordline voltage level 213 for the lower interface memory cell 220 prior to decreasing the wordline voltage levels 213 for the lower deck memory cells 232, and decreases the wordline voltage levels 213 for the lower deck memory cells 232 prior to decreasing the wordline voltage level 213 for the lower select gate 234.

Decreasing (or switching) one or more of the wordline voltage levels 213 may include decreasing the wordline voltage levels 213 from one or more first voltage levels (e.g., 10 V, 8 V, 5 V, another Von voltage, or a Vvfy voltage) to one or more second voltage levels (e.g., 0 V, −0.5 V, etc.), according to one embodiment. Decreasing one or more of the wordline voltage levels 213 may include decreasing the wordline voltage levels 213 from one or more first voltage levels (e.g., 10 V, 8 V, 5 V, another Von voltage, or a Vvfy voltage) to an intermediate voltage level (e.g., 5 V or VCC) prior to again decreasing the wordline voltage levels 213 to one or more second voltage levels (e.g., 0 V, −0.5 V, etc.), according to one embodiment.

In one implementation, the wordline control logic 120, the charge draining logic 142, and/or the memory controller 112 (shown in FIG. 1) decrease the wordline voltage level 213 for the upper interface memory cell 222 prior to decreasing the wordline voltage levels 213 for the upper deck memory cells 236, and decreases the wordline voltage levels 213 for the upper deck memory cells 236 prior to decreasing the wordline voltage level 213 for the upper select gate 238. Decreasing one or more of the wordline voltage levels 213 may include decreasing the wordline voltage levels 213 from one or more first voltage levels (e.g., 10 V, 8 V, 5 V, another Von voltage, or a Vvfy voltage) to one or more second voltage levels (e.g., 0 V or ground), according to one embodiment. Decreasing one or more of the wordline voltage levels 213 may include decreasing the wordline voltage levels 213 from one or more first voltage levels (e.g., 10 V, 8 V, 5 V, another Von voltage, or a Vvfy voltage) to an intermediate voltage level (e.g., 5 V or VCC) prior to again decreasing the wordline voltage levels 213 to one or more second voltage levels (e.g., 0 V or ground), according to one embodiment.

Figure 3:
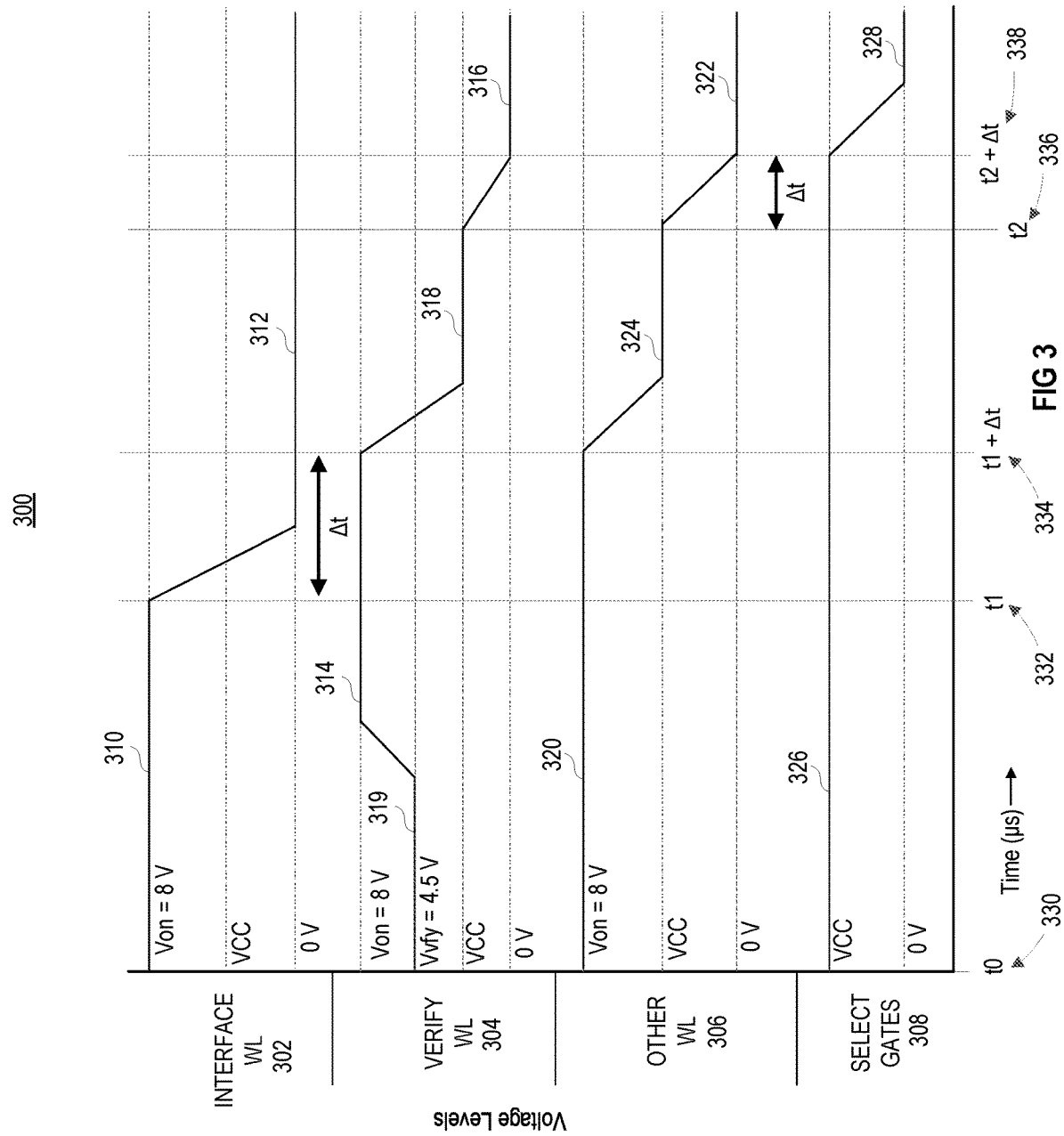
FIG. 3 is an illustrative timing diagram for reducing program disturb degradation in flash memory, in accordance with at least one embodiment described herein.

FIG. 3 is an illustrative timing diagram 300 for reducing program disturb degradation in flash memory, during a program verify operation, in accordance with at least one embodiment described herein. The timing diagram 300 includes voltage level timing for interface wordlines ("WL") 302, verify wordline 304, other wordlines 306, and select gates 308, in accordance with at least one embodiment described herein. The y-axis for the timing diagram 300 represents voltage levels, and the x-axis represents time (e.g., in µs), according to one embodiment.

The interface wordlines 302 may receive voltages that range from a first voltage level 310 to a second voltage level 312, according to one embodiment. The interface wordlines 302 represent one or more of the interface wordlines 148 (shown in FIG. 1) and the interface wordlines 224, 226 (shown in FIG. 2), according to one embodiment. The first voltage level 310 is Von, which is a voltage that is applied to the interface wordlines 302 to cause the channels for the interface memory cells to be inverted with electrons, according to one embodiment. The first voltage level 310 is Von and may be 8 V, according to one embodiment. However, the first voltage level 310 may include a Von that is greater than or less than 8 V, depending upon the threshold voltages ("Vth") established for the interface memory cells (e.g., dummy cells), according to one embodiment. The second voltage level 312 is 0 V or ground, according to one embodiment. The second voltage level 312 is a voltage level that is less than the first voltage level 310 and is less than the threshold voltage for the interface memory cells, according to one embodiment. In other words, the second voltage level 312 has a lower magnitude than the first voltage level 310, according to one embodiment.

The verify wordline 304 receives voltage levels that range from a first voltage level 314 to a second voltage level 316, according to one embodiment. The verify wordline 304 represents a wordline associated with a memory cell that is being program verified, and is one of the lower wordlines 228 or one of the upper wordlines 230, according to one embodiment. The first voltage level 314 is Von, which is a voltage that is applied to the verify wordline 304 to ensure that the channels of the memory cells are fully inverted, according to one embodiment. The first voltage level 314 is Von and may be 8 V, according to one embodiment. However, the first voltage level 314 may include a Von that is greater than or less than 8 V, according to one embodiment. The second voltage level 316 may be 0 V or ground, according to one embodiment. The second voltage level 316 is a voltage level that is less than the first voltage level 314 and is less than the threshold voltage for the memory cell being program verified, according to one embodiment. The verify wordline 304 may receive a third voltage level 318 that is between the first voltage level 314 and the second voltage level 316, according to one embodiment. The third voltage level 318 may be VCC, according to one embodiment. The third voltage level 318 may be VCC and may be equal to 3.3 V, according to one embodiment.

The verify wordline 304 may also receive a fourth voltage level 319, which is a voltage that is applied to the verify wordline 304 to determine a threshold voltage for a memory cell that is being verified after being programmed, according to one embodiment. The fourth voltage level 319 is Vvfy and may be 4.5 V, according to one embodiment. However, the fourth voltage level 319 may include a Vvfy that is greater than or less than 4.5 V, depending upon the program level and threshold voltage that the memory cell is being programmed to (e.g., L0, L1, L2, etc.), according to one embodiment. The fourth voltage level 319 may be initially applied to the verify wordline 304 during a program verify operation and may be switched up to the first voltage level 314 prior to switching the interface wordlines 302 from the first voltage level 310 to the second voltage level 312, according to one embodiment.

The other wordlines 306 receive voltage levels that range from a first voltage level 320 to a second voltage level 322, according to one embodiment. The other wordlines 306 represent one or more of the other wordlines 150 (shown in FIG. 1) and the lower wordlines 228 and the upper wordlines 230 (shown in FIG. 2), according to one embodiment. The first voltage level 320 is Von, which may be a voltage that is applied to the other wordlines 306 to ensure that channels for the memory cells that are not being verified are inverted with electrons, to facilitate program verification of the memory cell that is being verified, according to one embodiment. The first voltage level 320 may be Von and is 8 V, according to one embodiment. However, the first voltage level 320 may include a Von that is greater than or less than 8 V, depending upon the threshold voltages established for the memory cells, according to one embodiment. The second voltage level 322 may be 0 V or ground, according to one embodiment. The second voltage level 322 is a voltage that is less than the first voltage level 320 and is less than the threshold voltage for the memory cells that are not being verified, according to one embodiment. The other wordlines 306 may receive a third voltage level 324 that is between the first voltage level 320 and the second voltage level 322, according to one embodiment. The third voltage level 324 may be VCC, according to one embodiment. The third voltage level 324 may be VCC and may be equal to 3.3 V, according to one embodiment.

The select gates 308 may receive voltage levels that range from a first voltage level 326 to a second voltage level 328, according to one embodiment. The select gates 308 represent one or more of the lower select gate 234 and the upper select gate 238 (shown in FIG. 2), according to one embodiment. The first voltage level 326 may be VCC, which is a voltage that is applied to the select gates 308 to cause the channels for the select gates to be inverted with electrons, according to one embodiment. The first voltage level 326 may be VCC and may be 3.3 V, according to one embodiment. However, the first voltage level 326 may include a VCC that is greater than or less than 3.3 V, depending upon the threshold voltages established for the select gates, according to one embodiment. The first voltage level 326 may be Von and may be 8 V or some voltage level other than VCC or Von, according to one embodiment. The second voltage level 328 may be 0 V or ground, according to one embodiment. The second voltage level 328 is a voltage that is less than the first voltage level 326 and is less than the threshold voltage for the select gates 308, according to one embodiment.

The timing of switching voltage levels represented in the timing diagram 300 causes or enables trapped, excessive, or undesirable electrons to migrate or otherwise travel through one or more of the select gates 308 to ground or to a voltage supply, in accordance with at least one embodiment described herein. At an initial time 330 during a program verify operation, the interface wordlines 302 are at a first voltage level 310, the verify wordline 304 is at the fourth voltage level 319, the other wordlines 306 are at the first voltage level 320, and the select gates 308 are at the first voltage level 326, according to one embodiment. The initial time 330 is t0, according to one embodiment.

At a first time 332, a voltage level of the interface wordline 302 transitions (e.g., is switched) from the first voltage level 310 to the second voltage level 312, according to one embodiment. At the first time 332, the verify wordline 304 has been switched from the fourth voltage level 319 (Vvfy), to the first voltage level 314 (Von), the other wordlines 306 remain at the first voltage level 320 (Von), and the select gates 308 remain at the first voltage level 326 (VCC), according to one embodiment. The first time 332 is t1, according to one embodiment.

At a second time 334, a voltage level of the verify wordline 304 transitions from the first voltage level 314 to the third voltage level 318, and voltage levels of the other wordlines 306 transition from the first voltage level 320 to the third voltage level 324, according to one embodiment. At the second time 334 the interface wordlines 302 remain at the second voltage level 312, and the select gates 308 remain at the first voltage level 326, according to one embodiment. The second time 334 is the first time 332 plus a time delay $\Delta t$ (i.e., t1+$\Delta t$), according to one embodiment. The time delay $\Delta t$ is a predetermined period of time, according to one embodiment. The time delay Δt may be greater than 1 μs, according to one embodiment. The time delay Δt may be less than 1 μs, according to one embodiment. The time delay Δt is in the range of 1-3 μs, according to one embodiment. The time delay Δt is approximately 2 μs, according to one embodiment. The time delay Δt reduces the likelihood of electrons from the highly doped interface N+ region to be trapped in the channel at the end of program verify pulse, and move to the inhibited WLs or memory cells in the next program pulse. The time delay Δt allows electrons that are in the channels of the interface memory cells to migrate through the select gates 308 to ground or to a source voltage, according to one embodiment.

In one embodiment, at the second time 334, a voltage level of the verify wordline 304 transitions from the first voltage level 314 to the second voltage level 316, and voltage levels of the other wordlines 306 transition from the first voltage level 320 to the second voltage level 322, without pausing at the third voltage level 318 and the third voltage level 324, according to one embodiment.

At a third time 336, a voltage level of the verify wordline 304 transitions from the third voltage level 318 to the second voltage level 316, and voltage levels of the other wordlines 306 transition from the third voltage level 324 to the second voltage level 322, according to one embodiment. The third time 336 is t2, according to one embodiment. At the third time 336 the interface wordlines 302 remain at the second voltage level 312, and the select gates 308 remain at the first voltage level 326, according to one embodiment. The third time 336 is a predetermined time (e.g., 1-10 μs) after the first time 332, according to one embodiment. The third time 336 is a predetermined time that is less than 1 μs, according to one embodiment.

At a fourth time 338, a voltage level of one or more of the select gates 308 transitions from the first voltage level 326 to the second voltage level 328, according to one embodiment. At the fourth time 338, the interface wordlines 302 remain at the second voltage level 312, the verify wordline 304 remains at the second voltage level 316, and the other wordlines 306 remain at the second voltage level 322, according to one embodiment. The fourth time 338 is the third time 336 plus a time delay Δt (i.e., t2+Δt), according to one embodiment. The time delay Δt is a second predetermined period of time and may be greater than 1 μs, according to one embodiment. The time delay Δt is less than 1 μs, according to one embodiment. The time delay Δt is in the range of 1-3 μs, according to one embodiment. The time delay Δt is approximately 2 μs, according to one embodiment. The time delay Δt reduces the likelihood of electrons in channel of the lower deck of a memory cell string being trapped in the channel of the lower deck of the memory cell string, and reduces the likelihood of electrons in the channel of the upper deck of the memory cell string being trapped in the channel of the upper deck of the memory cell string, during a program verify operation, according to one embodiment. The time delay Δt reduces the likelihood of electrons migrating through a memory cell string channel during a program operation and interfering with Fowler-Nordheim tunneling programming operations of floating gates of memory cells, in a subsequent program operation, according to one embodiment. The time delay Δt allows electrons that are in the channels of the lower deck to migrate through a lower select gate to ground, and allow electrons that are in the channel of the upper deck to migrate through the upper select gate to a source voltage, before the select gates 308 are switch off, according to one embodiment.

At the second time 334 and at the fourth time 338, a time delay Δt is added to the first time 332 and to the third time 336, respectively. In one embodiment, the time delay Δt at the second time 334 is a first time delay $Δt_1$ and the time delay Δt at the fourth time 338 is a second time delay $Δt_2$. The first time delay $Δt_1$ is the same duration as the second time delay $Δt_2$, according to one embodiment. The first time delay $Δt_1$ is longer or shorter than the duration of the second time delay $Δt_2$, according to one embodiment.

In one embodiment, the wordline control logic 120 switches other wordlines of the lower bank to a lower voltage level prior to switching the other wordlines of the upper bank to a lower voltage level. In one embodiment, the wordline control logic 120 switches other wordlines of the upper bank to a lower voltage level prior to switching the other wordlines of the lower bank to a lower voltage level. In one embodiment, the wordline control logic 120 approximately concurrently switches the other wordlines of the upper bank and the lower bank to a lower voltage level, after switching the voltage level of the interface wordlines 302 to a lower voltage level.

Figure 4:
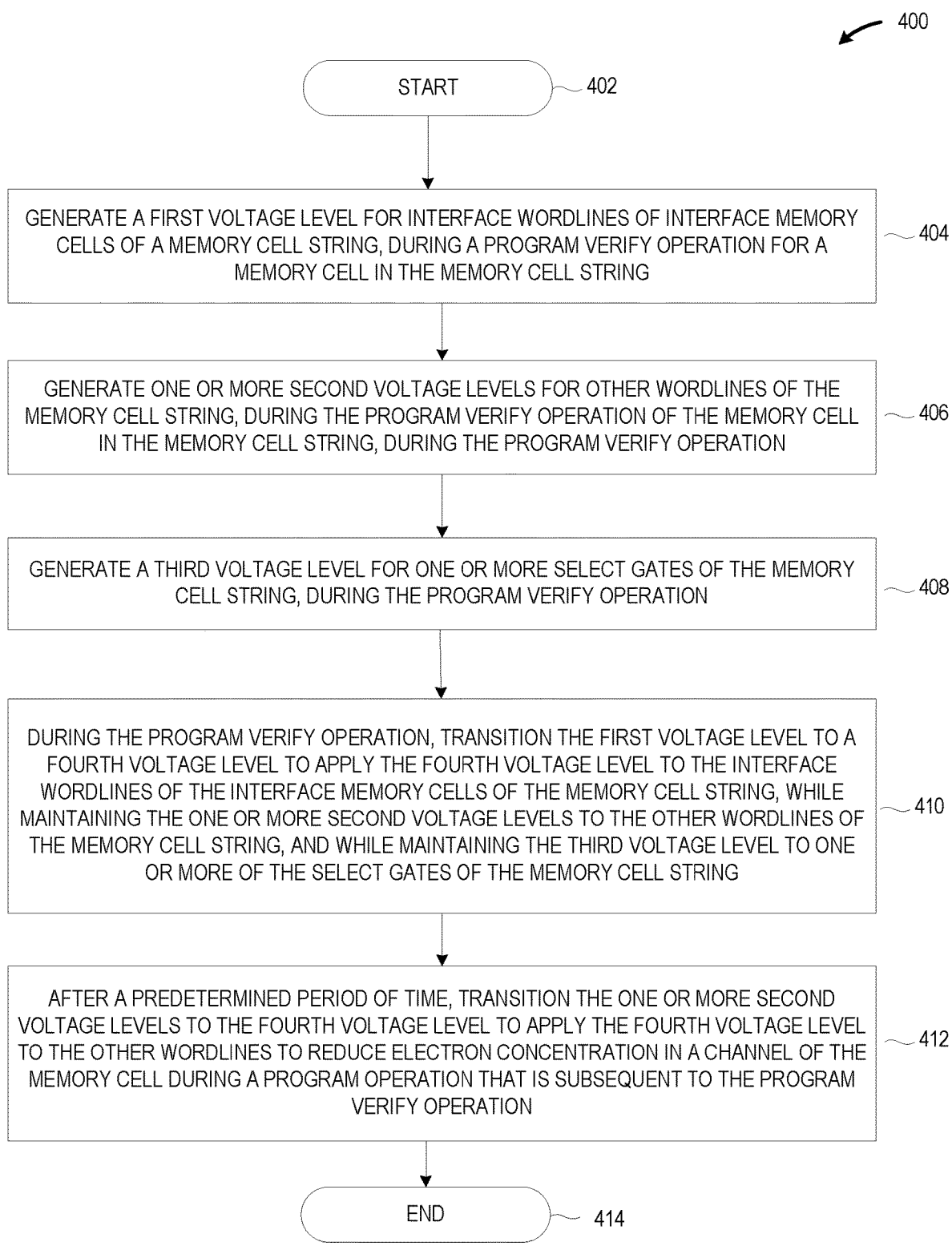
FIG. 4 is a high-level logic flow diagram of an illustrative method of reducing program disturb degradation in flash memory, in accordance with at least one embodiment described herein.

FIG. 4 is a high-level logic flow diagram of an illustrative method 400 for reducing program disturb degradation in a flash memory array, in accordance with at least one embodiment described herein. The method 400 commences at 402.

At 404, the method 400 includes generating a first voltage level for interface wordlines of interface memory cells of a memory cell string, during a program verify operation for a memory cell in the memory cell string, according to one embodiment. The memory cell string may be one of a plurality of memory cell strings in a flash memory array, according to one embodiment.

At 406, the method 400 includes generating one or more second voltage levels for other wordlines of the memory cell string, during the program verify operation of the memory cell in the memory cell string, during the program verify operation, according to one embodiment.

At 408, the method 400 includes generating a third voltage level for one or more select gates of the memory cell string, during the program verify operation, according to one embodiment.

At 410, the method 400 includes, during the program verify operation, transitioning the first voltage level to a fourth voltage level to apply the fourth voltage level to the interface wordlines of the interface memory cells of the memory cell string, while maintaining the one or more second voltage levels to the other wordlines of the memory cell string, and while maintaining the third voltage level to one or more of the select gates of the memory cell string, according to one embodiment. The fourth voltage level is less than the first voltage level, is less than the one or more second voltage levels, and is less than the third voltage level, according to one embodiment.

At 412, the method 400 includes, after a predetermined period of time, transitioning the one or more second voltage levels to the fourth voltage level to apply the fourth voltage level to the other wordlines to reduce electron concentration in a channel of the memory cell during a program operation that is subsequent to the program verify operation, according to one embodiment.

The method 400 concludes at 414.

Figure 5:
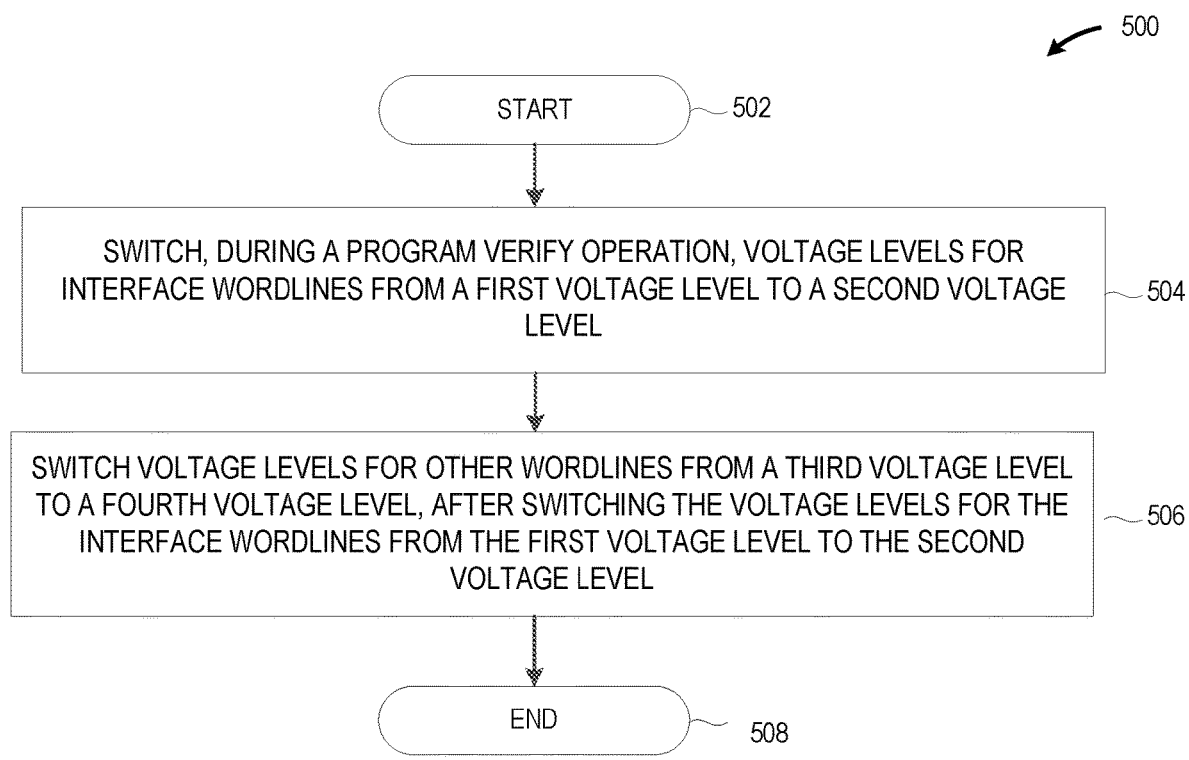
FIG. 5 is a high-level logic flow diagram of an illustrative method of reducing program disturb degradation in flash memory, in accordance with at least one embodiment described herein.

FIG. 5 is a high-level logic flow diagram of an illustrative method 500 for reducing program disturb degradation in a flash memory array, in accordance with at least one embodiment described herein. The method 500 commences at 502.

At 504, the method 500 includes, during a program verify operation, switching voltage levels for interface wordlines from a first voltage level to a second voltage level, according to one embodiment.

At 506, the method 500 includes switching voltage levels for other wordlines from a third voltage level to a fourth voltage level after switching the voltage levels for the interface wordlines from a first voltage level to a second voltage level, according to one embodiment.

The method 500 concludes at 508.

Figure 6A:
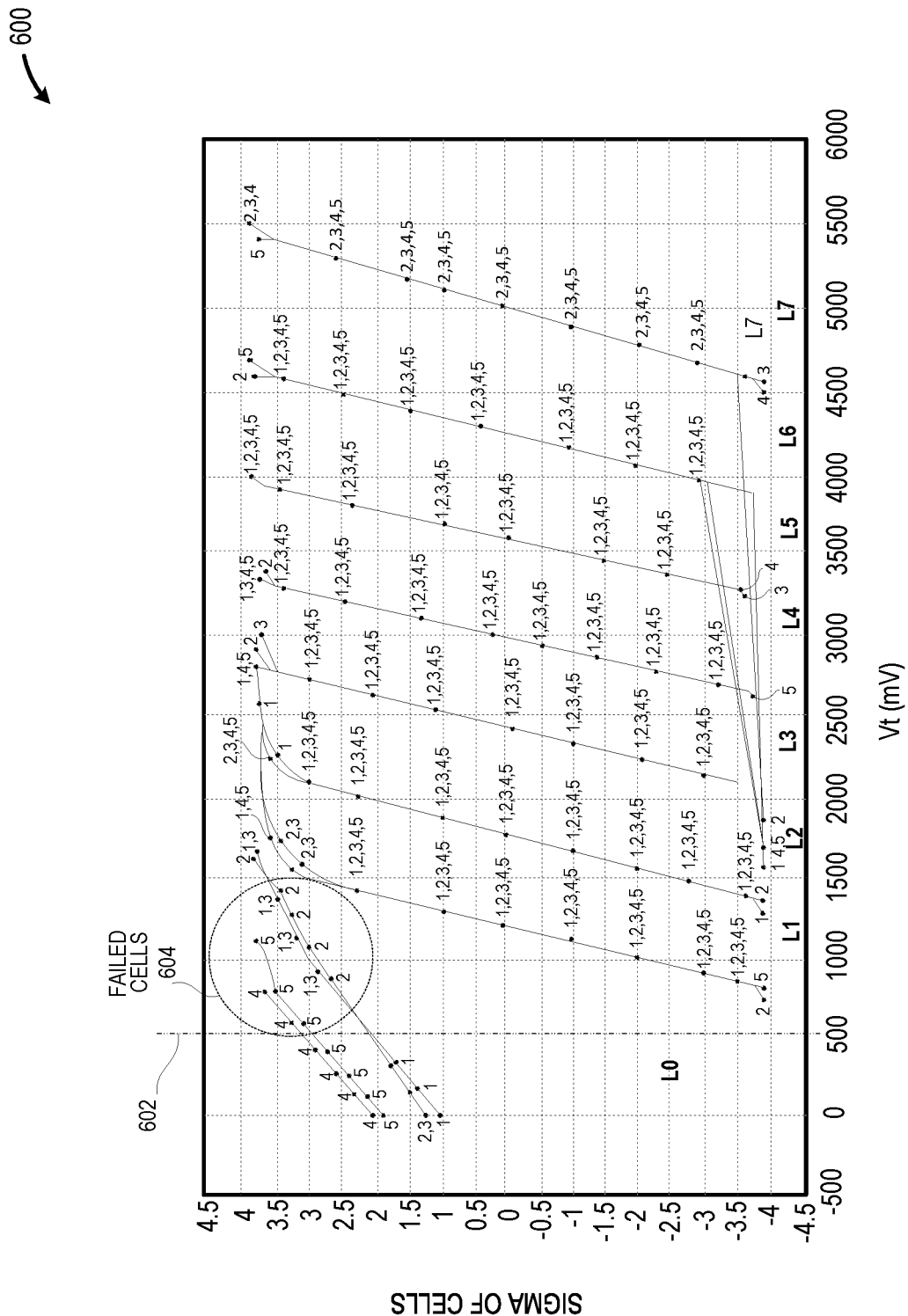
FIGS. 6A and 6B are example diagrams that illustrate potential decreases in program disturb degradation through the implementation of one or more disclosed embodiments, in accordance with at least one embodiment described herein.
Figure 6B:
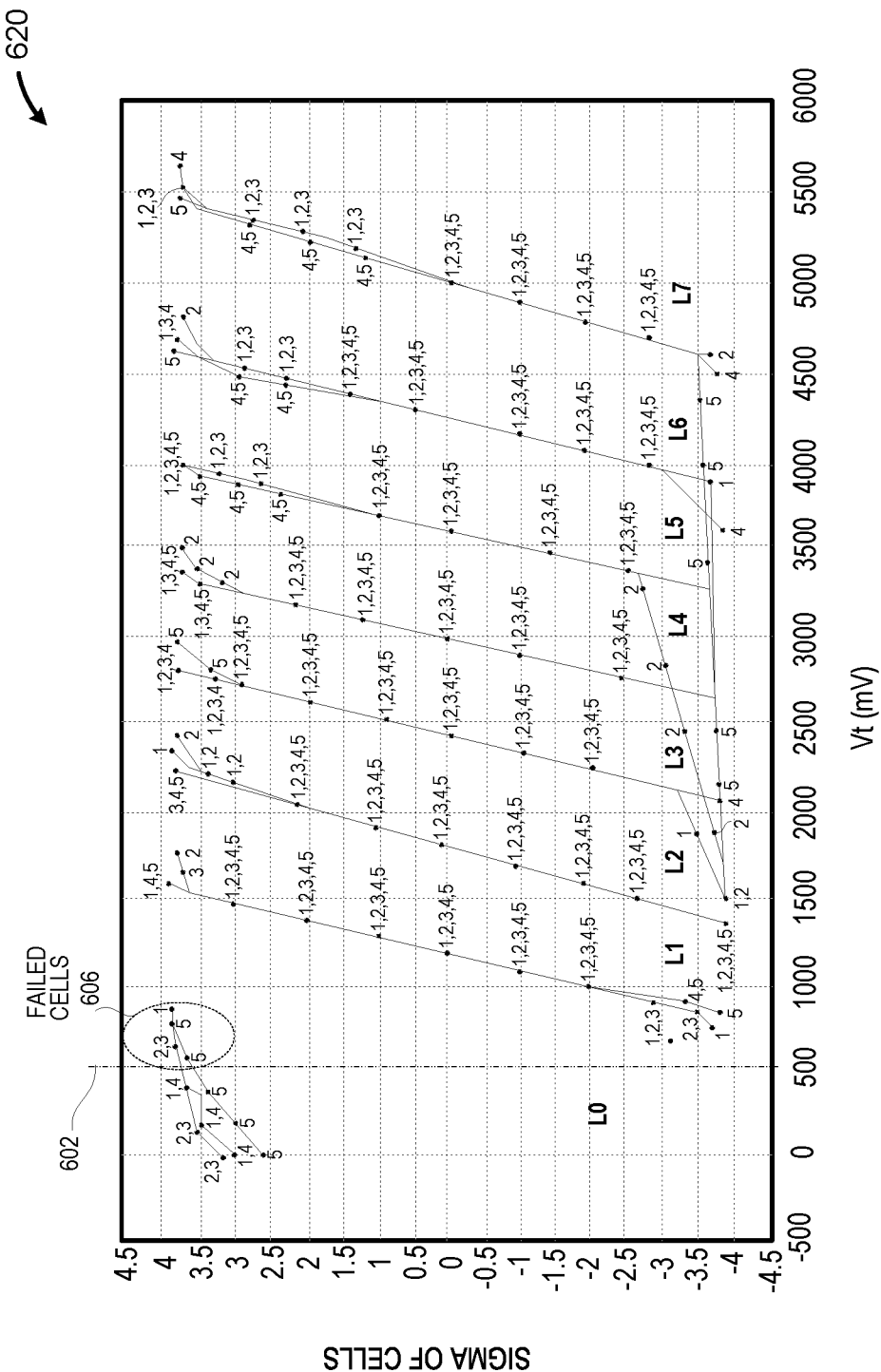

FIGS. 6A and 6B are example diagrams 600 and 620 that illustrate potential decreases in program disturb degradation through the implementation of one or more embodiments of the present disclosure. The diagram 600 shows the distribution of threshold voltages ("Vt") in millivolts for TLC memory cells programmed in an upper deck of a memory cell string. The diagram 600 includes an example read level 602 of 500 mV for level 0 ("L0") cells. The failed cells 604 are memory cells that ended up with threshold voltages that exceed the read level 602 established or defined for the L0 programming level, according to one embodiment.

The diagram 620 shows the distribution of threshold voltages ("Vt") in millivolts for TLC memory cells programmed in an upper deck of a memory cell string, after applying the wordline sequencing techniques of the present disclosure, according to one embodiment. The failed cells 606 are significantly lower in quantity than the quantity of failed cells 604 in the distribution that does not include the wordline sequencing techniques of the present disclosure, according to one embodiment.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment", "an embodiment", or "an implementation" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hard-wired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, within the memory controller 112 that executes code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog—Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a memory controller, a method, and a system related to reducing program disturb degradation in a memory array, as discussed below.

Example 1

According to this example, there is provided a memory controller. The memory controller includes charge draining logic to define a sequence of wordline switching operations during a program verify operation of a memory array. The sequence of wordline switching operations are to enable a charge drain of a channel of at least one memory cell string of a memory array. The memory controller includes wordline control logic to, during the program verify operation, switch first wordlines of the memory array from a first voltage level to a second voltage level prior to switching second wordlines of the memory array from the first voltage level to the second voltage level.

Example 2

This example includes the elements of example 1, wherein the first wordlines are interface wordlines, wherein the second wordlines are non-interface wordlines.

Example 3

This example includes the elements of example 2, wherein at least part of the interface wordlines are control gates for interface memory cells that are adjacent to an interface plug that couples a lower pillar to an upper pillar of a 3D NAND memory array.

Example 4

This example includes the elements of example 1, wherein the wordline control logic switches the first wordlines of the memory array from the first voltage level to the second voltage level a predetermined period of time before the wordline control logic switches the second wordlines of the memory array from the first voltage level to the second voltage level.

Example 5

This example includes the elements of example 1, wherein the wordline control logic switches control gates of select gates of the at least one memory cell string of the memory array from a third voltage level to a fourth voltage level after the first wordlines switch to the second voltage level.

Example 6

This example includes the elements of example 1, wherein the wordline control logic switches control gates of select gates of the at least one memory cell string of the memory array from a third voltage level to a fourth voltage level after the first wordlines switch to the second voltage level and after the second wordlines switch to the second voltage level.

Example 7

This example includes the elements of example 1, wherein the program verify operation succeeds a first program operation and precedes a second program operation.

Example 8

This example includes the elements of example 7, wherein the charge draining logic includes at least one of wordline switching sequence logic to define the sequence of wordline switching operations, and wordline switching time delays logic to define time delays within the sequence of wordline switching operations.

Example 9

According to this example, there is provided a system. The system includes a memory array having a plurality of memory cells. The memory array includes at least one memory cell string, and the memory array includes first wordlines and second wordlines. The system includes a memory controller. The memory controller includes charge draining logic to define a sequence of wordline switching operations during a program verify operation of the memory array. The sequence of wordline switching operations to enable a charge drain of a channel of the at least one memory cell string of the memory array. The memory controller includes wordline control logic to, during the program verify operation, switch the first wordlines of the memory array from a first voltage level to a second voltage level prior to switching the second wordlines of the memory array from the first voltage level to the second voltage level.

Example 10

This example includes the elements of example 9, wherein the first wordlines are interface wordlines wherein the second wordlines are non-interface wordlines.

Example 11

This example includes the elements of example 10, wherein the interface wordlines include control gates for interface memory cells that are adjacent to an interface plug that couples a lower pillar to an upper pillar of a 3D NAND memory array.

Example 12

This example includes the elements of example 9, wherein the wordline control logic switches the first wordlines of the memory array from the first voltage level to the second voltage level a predetermined period of time before the wordline control logic switches the second wordlines of the memory array from the first voltage level to the second voltage level.

Example 13

This example includes the elements of example 9, wherein the wordline control logic switches control gates of select gates of the at least one memory cell string of the memory array from a third voltage level to a fourth voltage level after the first wordlines switch to the second voltage level.

Example 14

This example includes the elements of example 9, wherein the wordline control logic switches control gates of select gates of the at least one memory cell string of the memory array from a third voltage level to a fourth voltage level after the first wordlines switch to the second voltage level and after the second wordlines switch to the second voltage level.

Example 15

This example includes the elements of example 9, wherein the program verify operation succeeds a first program operation and precedes a second program operation.

Example 16

This example includes the elements of example 9, wherein the at least one memory cell string includes interface memory cells formed around a doped interface plug, wherein the interface memory cells include interface control gates that at least partially function as interface wordlines, wherein the interface wordlines are the first wordlines of the memory array; an upper deck of memory cells coupled to the channel of the at least one memory cell string, wherein the upper deck of memory cells includes upper control gates that at least partially define upper deck wordlines, wherein the upper deck wordlines are some of the second wordlines of the memory array; and a lower deck of memory cells coupled to the channel of the at least one memory cell string, wherein the lower deck of memory cells includes lower control gates that at least partially define lower deck wordlines, wherein the lower deck wordlines are some of the second wordlines of the memory array.

Example 17

According to this example, there is provided a computer readable storage device. The computer readable storage device stored instructions that when executed by one or more processors result in operations. The operations include switch, during a program verify operation, voltage levels for interface wordlines from a first voltage level to a second voltage level; and switch voltage levels for other wordlines from a third voltage level to a fourth voltage level, after the voltage levels for the interface wordlines switch from the first voltage level to the second voltage level

Example 18

This example includes the elements of example 17, wherein the operations further include wait a predetermined period of time before the voltage levels for the other wordlines switch from the third voltage level to the fourth voltage level.

Example 19

This example includes the elements of example 17, wherein the operations further include switch control gates of select gates of memory cell strings, from a fifth voltage level to a sixth voltage level, a second predetermined period of time after the voltage levels for the other wordlines switch from a third voltage level to a fourth voltage level.

Example 20

This example includes the elements of example 17, wherein the operations further include switch the voltage levels for the other wordlines to a first intermediate voltage level between the third voltage level and the fourth voltage level, prior to switching the other wordlines to the fourth voltage level.

Example 21

This example includes the elements of example 17, wherein at least one of the other wordlines is a verify wordline, wherein the operations further include switch the voltage level for the verify wordline from a verify voltage level to the first voltage level, prior to switching the voltage levels for the interface wordlines from the first voltage level to the second voltage level.

Example 22

According to this example, there is provided a method. The method includes switching, during a program verify operation, voltage levels for interface wordlines from a first voltage level to a second voltage level; and switching voltage levels for other wordlines from a third voltage level to a fourth voltage level, after the voltage levels for the interface wordlines switch from the first voltage level to the second voltage level.

Example 23

This example includes the elements of example 22, wherein the third voltage exceeds a threshold voltage for memory cells controlled by the other wordlines, to enable channel inversion of the memory cells controlled by the other wordlines.

Example 24

This example includes the elements of example 22, wherein the first voltage level equals the third voltage level, wherein one or more of the second voltage level and the fourth voltage level is ground.

Example 25

This example includes the elements of example 22, further including waiting a predetermined period of time before switching the voltage levels for the other wordlines from the third voltage level to the fourth voltage level.

Example 26

This example includes the elements of example 22, further including switching control gates of select gates of memory cell strings, from a fifth voltage level to a sixth voltage level, a second predetermined period of time after switching the voltage levels for the other wordlines from the third voltage level to the fourth voltage level.

Example 27

This example includes the elements of example 22, further including switching the voltage levels for the other wordlines to a first intermediate voltage level between the third voltage level and the fourth voltage level, prior to switching the other wordlines to the fourth voltage level.

Example 28

This example includes the elements of example 22, wherein at least one of the other wordlines is a verify wordline, wherein the method further includes switching the voltage level for the verify wordline from a verify voltage level to the first voltage level, prior to switching the voltage levels for the interface wordlines from the first voltage level to the second voltage level.

Example 29

According to this example, there is provided a memory controller. The memory controller includes means for switching, during a program verify operation, voltage levels for interface wordlines from a first voltage level to a second voltage level; and means for switching voltage levels for other wordlines from a third voltage level to a fourth voltage level, after the voltage levels for the interface wordlines switch from the first voltage level to the second voltage level.

Example 30

This example includes the elements of example 29, further including means for waiting a predetermined period of time before switching the voltage levels for the other wordlines from the third voltage level to the fourth voltage level.

Example 31

This example includes the elements of example 29, further including means for switching control gates of select gates of memory cell strings, from a fifth voltage level to a sixth voltage level, a second predetermined period of time after the voltage levels for the other wordlines switch from a third voltage level to a fourth voltage level.

Example 32

This example includes the elements of example 29, further including means for switching the voltage levels for the other wordlines to a first intermediate voltage level between the third voltage level and the fourth voltage level, prior to switching the other wordlines to the fourth voltage level.

Example 33

This example includes the elements of example 29, wherein at least one of the other wordlines is a verify wordline, the memory controller further including means for switching the voltage level for the verify wordline from a verify voltage level to the first voltage level, prior to switching the voltage levels for the interface wordlines from the first voltage level to the second voltage level.

Example 34

According to this example, there is provided the system of any one of examples 9 to 16, further including processor circuitry.

Example 35

According to this example, there is provided a device comprising means to perform the method of any one of examples 22 to 28.

Example 36

According to this example, there is provided a computer readable storage device having stored thereon instructions that when executed by one or more processors result in operations including the method according to any one of examples 22 to 28.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A memory controller, comprising:
charge draining logic to define a sequence of wordline switching operations during a program verify operation of a memory array, the sequence of wordline switching operations to enable a charge drain of a channel of at least one memory cell string of a memory array;
wherein the at least one memory cell string includes:
a first plurality of memory cells coupled to an upper source gate to enable a charge drain to a voltage source; and
a second plurality of memory cells coupled to a lower source gate to enable a charge drain to ground; and
wordline control logic to, during the program verify operation:
initiate a switch of first wordlines of the memory array from a first voltage level to a second voltage level; and
after a predetermined delay following the switch of the first wordlines from the first voltage level to the second voltage level, initiate a switch of second wordlines of the memory array from the first voltage level to the second voltage level.

2. The memory controller of claim 1, wherein the first wordlines are interface wordlines, and wherein the second wordlines are non-interface wordlines.

3. The memory controller of claim 2, wherein at least part of the interface wordlines are control gates for interface memory cells that are adjacent to an interface plug that couples a lower pillar to an upper pillar of a 3D NAND memory array.

4. The memory controller of claim 1, wherein the wordline control logic switches control gates of select gates of the at least one memory cell string of the memory array from a third voltage level to a fourth voltage level after the first wordlines switch to the second voltage level.

5. The memory controller of claim 1, wherein the wordline control logic switches control gates of select gates of the at least one memory cell string of the memory array from a third voltage level to a fourth voltage level after the first wordlines switch to the second voltage level and after the second wordlines switch to the second voltage level.

6. The memory controller of claim 1, wherein the program verify operation succeeds a first program operation and precedes a second program operation.

7. The memory controller of claim 1, wherein the charge draining logic includes at least one of wordline switching sequence logic to define the sequence of wordline switching operations, and wordline switching time delays logic to define time delays within the sequence of wordline switching operations.

8. A system, comprising:
a memory array having a plurality of memory cells, the memory array including at least one memory cell string, the memory array including first wordlines and second wordlines; and
a memory controller, wherein the memory controller includes:
charge draining logic to define a sequence of wordline switching operations during a program verify operation of the memory array, the sequence of wordline switching operations to enable a charge drain of a channel of the at least one memory cell string of the memory array
wherein the at least one memory cell string includes:
a first plurality of memory cells coupled to an upper source gate to enable a charge drain to a voltage source; and
a second plurality of memory cells coupled to a lower source gate to enable a charge drain to ground; and
wordline control logic to, during the program verify operation:
initiate a switch of the first wordlines of the memory array from a first voltage level to a second voltage level; and
after a predetermined delay following the switch of the first wordlines from the first voltage level to the second voltage level, initiate a switch of the second wordlines of the memory array from the first voltage level to the second voltage level.

9. The system of claim 8, wherein the first wordlines are interface wordlines and wherein the second wordlines are non-interface wordlines.

10. The system of claim 9, wherein the interface wordlines include control gates for interface memory cells that are adjacent to an interface plug that couples a lower pillar to an upper pillar of a 3D NAND memory array.

11. The system of claim 8, wherein the wordline control logic switches control gates of select gates of the at least one memory cell string of the memory array from a third voltage level to a fourth voltage level after the first wordlines switch to the second voltage level.

12. The system of claim 8, wherein the wordline control logic switches control gates of select gates of the at least one memory cell string of the memory array from a third voltage level to a fourth voltage level after the first wordlines switch to the second voltage level and after the second wordlines switch to the second voltage level.

13. The system of claim 8, wherein the program verify operation succeeds a first program operation and precedes a second program operation.

14. The system of claim 8, wherein the at least one memory cell string includes:
interface memory cells formed around a doped interface plug, wherein the interface memory cells include interface control gates that at least partially function as interface wordlines, wherein the interface wordlines are the first wordlines of the memory array;
an upper deck of memory cells coupled to the channel of the at least one memory cell string, wherein the upper deck of memory cells includes upper control gates that at least partially define upper deck wordlines, wherein the upper deck wordlines are some of the second wordlines of the memory array; and
a lower deck of memory cells coupled to the channel of the at least one memory cell string, wherein the lower deck of memory cells includes lower control gates that at least partially define lower deck wordlines, wherein the lower deck wordlines are some of the second wordlines of the memory array.

15. A computer readable storage device having stored thereon instructions that when executed by one or more processors result in operations, comprising:
initiating a switch, during a program verify operation, of voltage levels for interface wordlines from a first voltage level to a second voltage level;
after a predetermined delay following the switch of the interface wordlines from the first voltage level to the second voltage level, initiating a switch of voltage levels for other wordlines from a third voltage level to a fourth voltage level; and
perform a defined sequence of wordline switching operations to enable a charge drain of a channel of at least one memory cell string of a memory array during a program verify operation;
wherein the at least one memory cell string includes:
a first plurality of memory cells coupled to an upper source gate to enable a charge drain to a voltage source; and
a second plurality of memory cells coupled to a lower source gate to enable a charge drain to ground.

16. The computer readable storage device of claim 15, wherein the operations further include:
initiating a switch of control gates of select gates of memory cell strings from a fifth voltage level to a sixth voltage level for a second predetermined period of time after the voltage levels for the other wordlines switch from a third voltage level to a fourth voltage level.

17. The computer readable storage device of claim 15, wherein the operations further include:
initiating a switch of the voltage levels for the other wordlines to a first intermediate voltage level between the third voltage level and the fourth voltage level, prior to switching the other wordlines to the fourth voltage level.

18. The computer readable storage device of claim 15, wherein at least one of the other wordlines is a verify wordline, and wherein the operations further include:
initiating a switch of the voltage level for the verify wordline from a verify voltage level to the first voltage level, prior to switching the voltage levels for the interface wordlines from the first voltage level to the second voltage level.

* * * * *